(12) United States Patent
Ikeda et al.

(10) Patent No.: US 11,227,934 B2
(45) Date of Patent: Jan. 18, 2022

(54) SEMICONDUCTOR DEVICE AND METHOD FOR MANUFACTURING THE SAME

(71) Applicant: KIOXIA CORPORATION, Tokyo (JP)

(72) Inventors: Mitsuo Ikeda, Yokkaichi Mie (JP); Daisuke Ikeno, Yokkaichi Mie (JP); Akihiro Kajita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,146

(22) Filed: Mar. 2, 2020

(65) Prior Publication Data

US 2021/0083069 A1 Mar. 18, 2021

(30) Foreign Application Priority Data

Sep. 17, 2019 (JP) .............................. JP2019-168480

(51) Int. Cl.
*H01L 29/51* (2006.01)
*H01L 27/11563* (2017.01)
*H01L 21/28* (2006.01)

(52) U.S. Cl.
CPC ...... *H01L 29/518* (2013.01); *H01L 27/11563* (2013.01); *H01L 29/40114* (2019.08); *H01L 29/40117* (2019.08)

(58) Field of Classification Search
CPC ............. H01L 29/518; H01L 29/40117; H01L 29/40114; H01L 27/11563; H01L 27/11556; H01L 27/11558; H01L 27/11582; H01L 27/11524; H01L 27/1157; G11C 5/063
See application file for complete search history.

(56) References Cited

U.S. PATENT DOCUMENTS

| 8,772,856 | B2 | 7/2014 | Ramaswamy | |
|---|---|---|---|---|
| 2015/0060955 | A1 | 3/2015 | Chen | |
| 2015/0364488 | A1* | 12/2015 | Pachamuthu | ..... H01L 27/11524 257/314 |
| 2016/0329341 | A1* | 11/2016 | Shimabukuro | ... H01L 27/11575 |
| 2018/0182771 | A1* | 6/2018 | Costa | .................. H01L 27/1157 |

FOREIGN PATENT DOCUMENTS

| JP | H0135507 B2 | 7/1989 |
|---|---|---|
| JP | H06-112442 A | 4/1994 |

* cited by examiner

*Primary Examiner* — Mohammed R Alam
(74) *Attorney, Agent, or Firm* — Foley & Lardner LLP

(57) ABSTRACT

According to one embodiment, a semiconductor device includes a substrate, a plurality of insulating films and a plurality of electrode films provided alternately on the substrate. The semiconductor device further includes a first insulating film, a first charge storage film, a third insulating film, a second charge storage film, a second insulating film, and a first semiconductor film that are sequentially provided along at least one side surface of each of the electrode films. The first charge storage film includes either (i) molybdenum, or (ii) titanium and nitrogen, and the second charge storage film includes a semiconductor film.

18 Claims, 16 Drawing Sheets

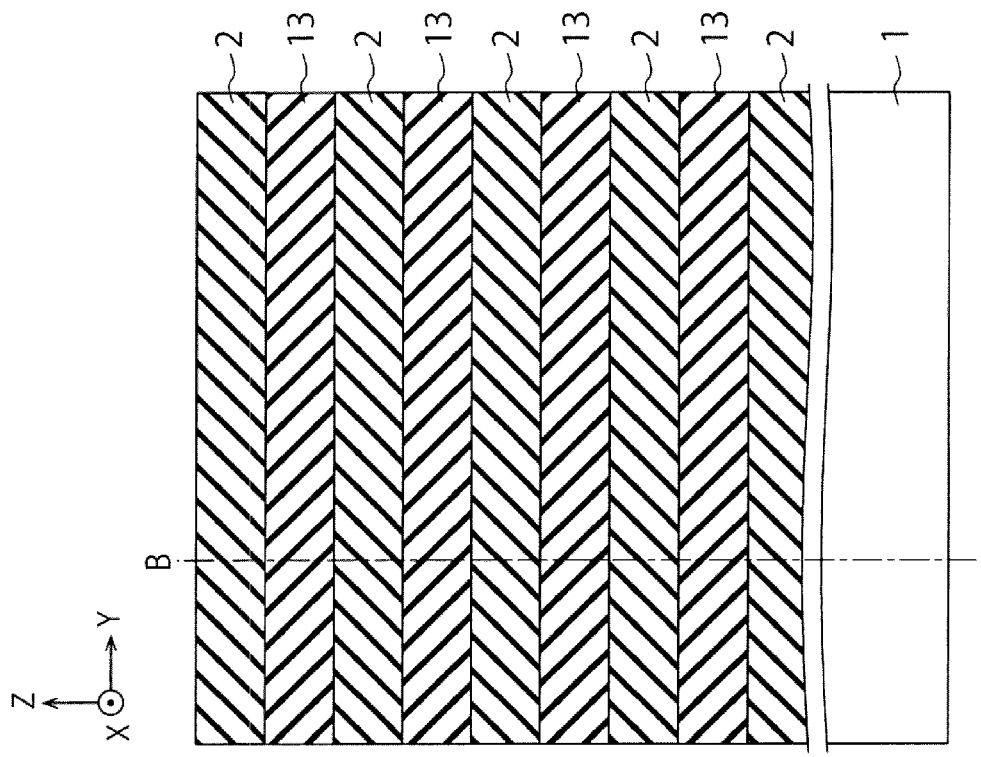
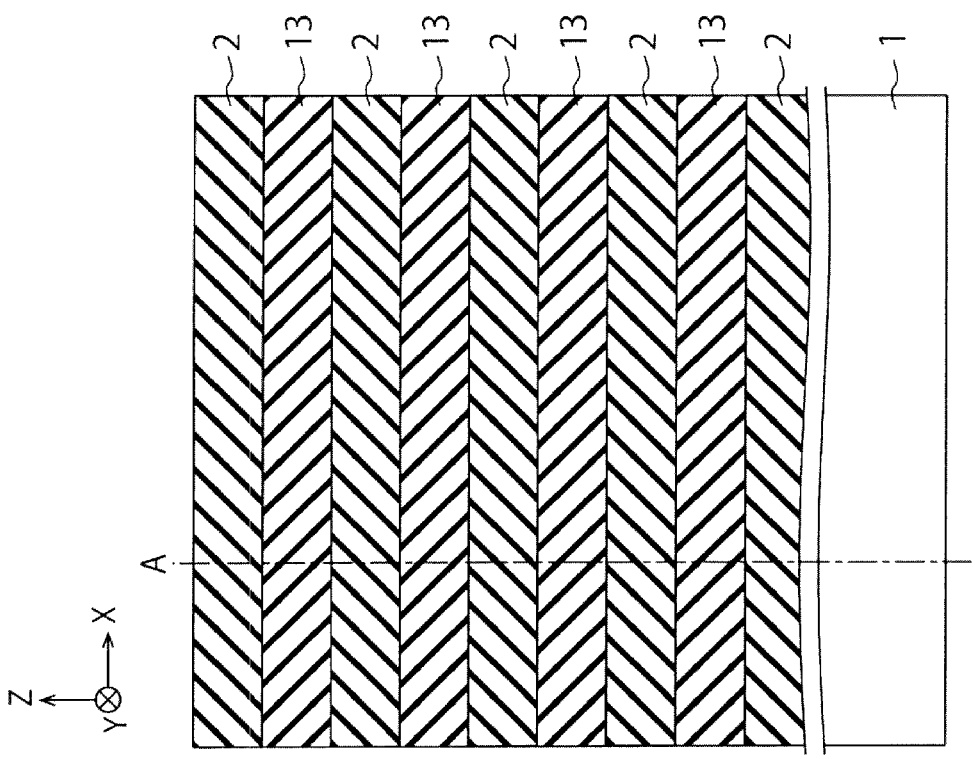

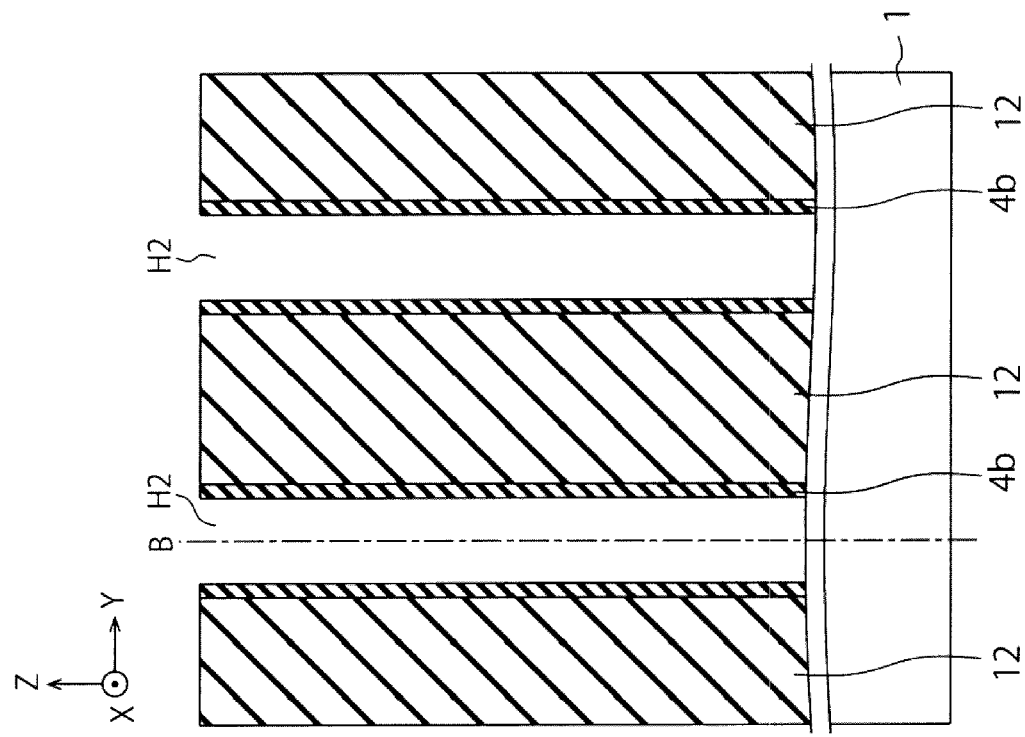
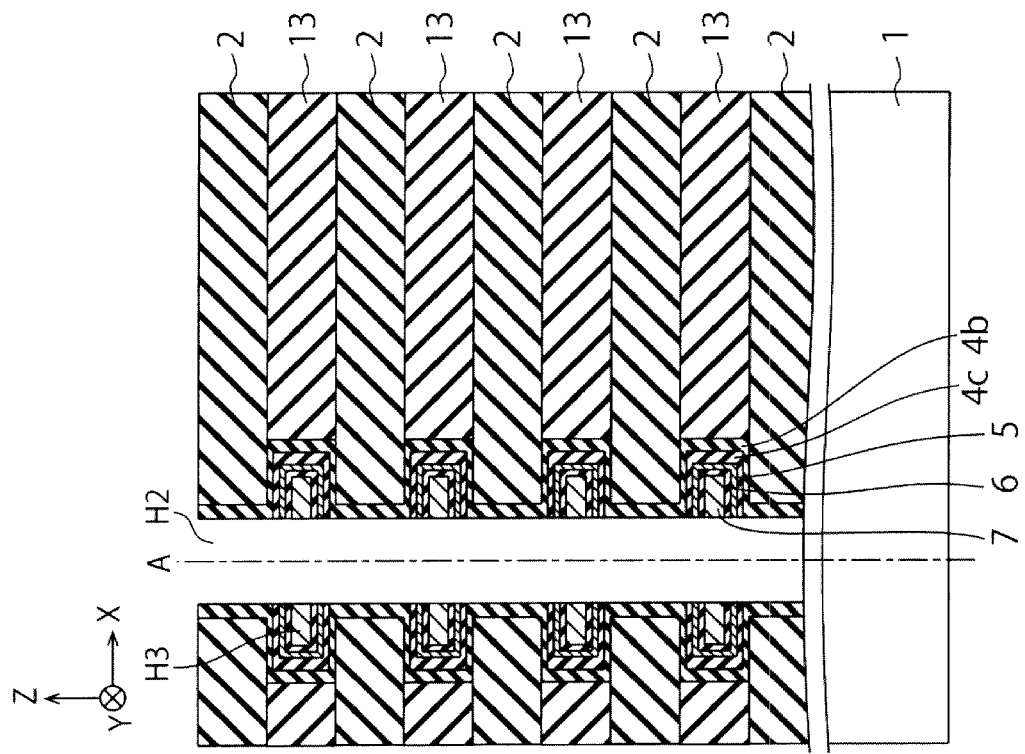

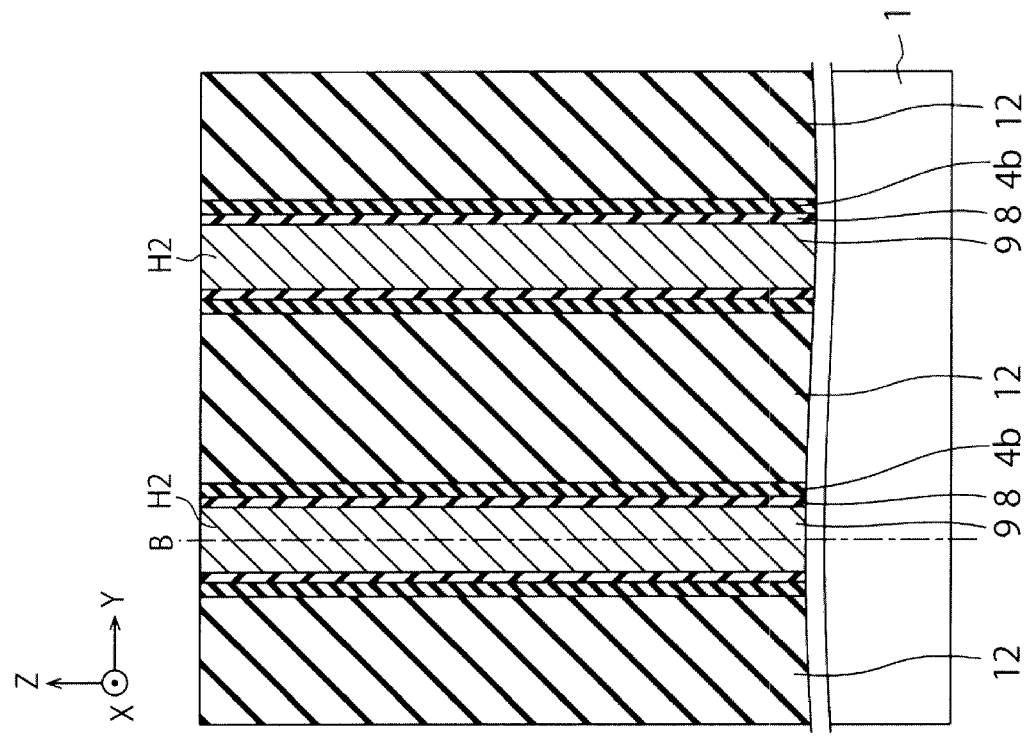
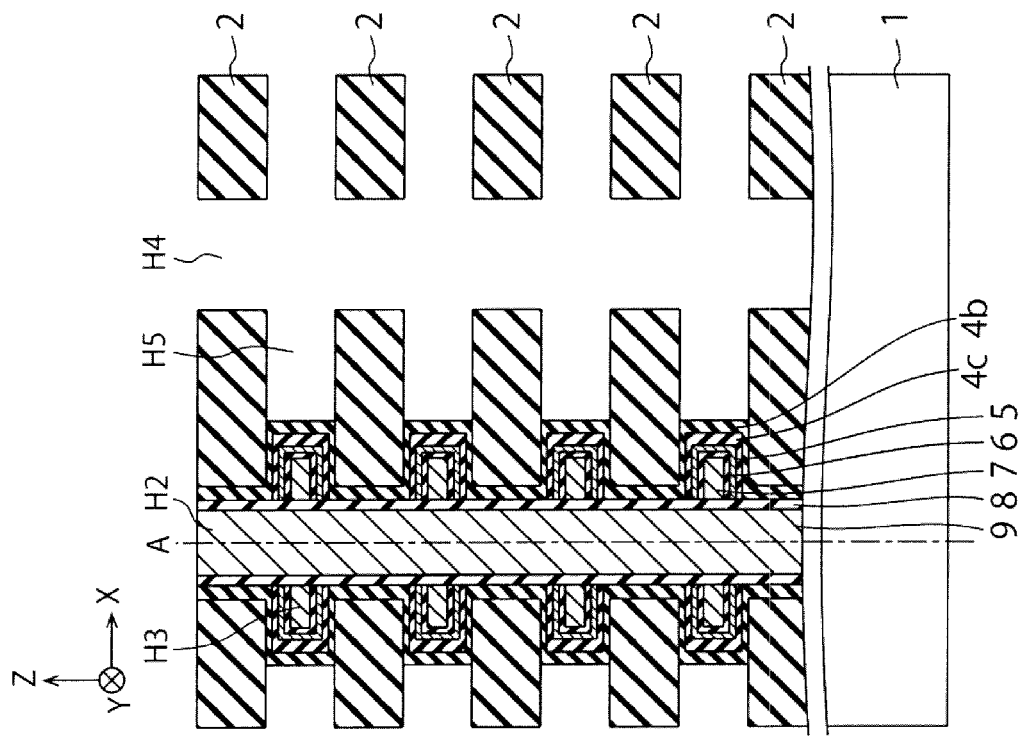
FIG. 9A
FIG. 9B

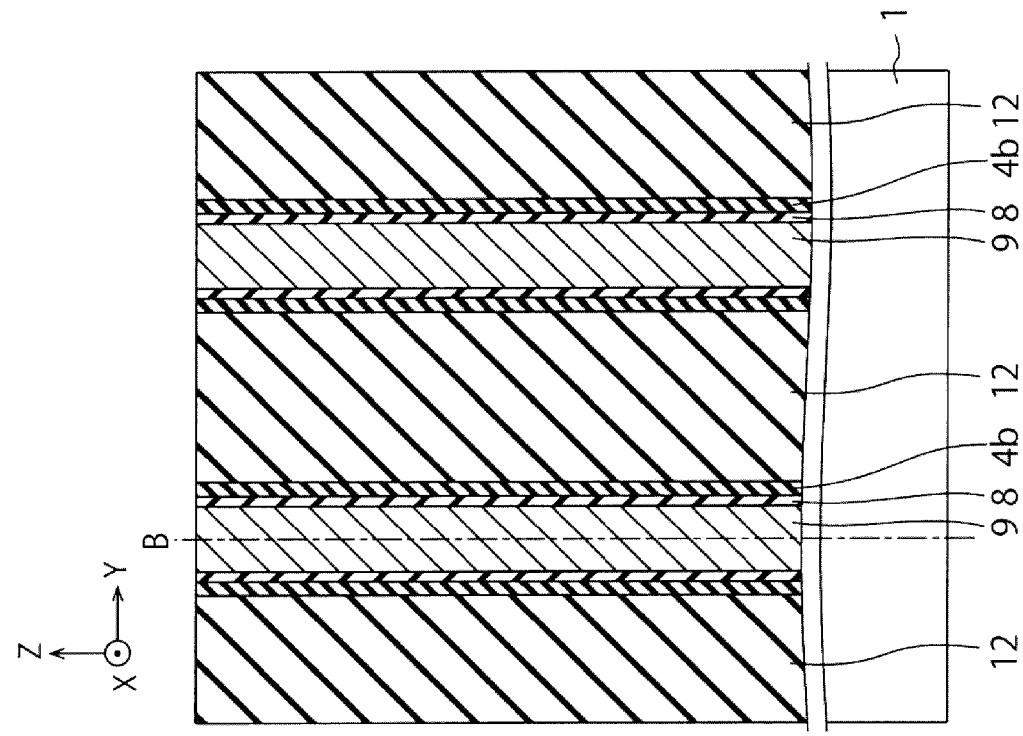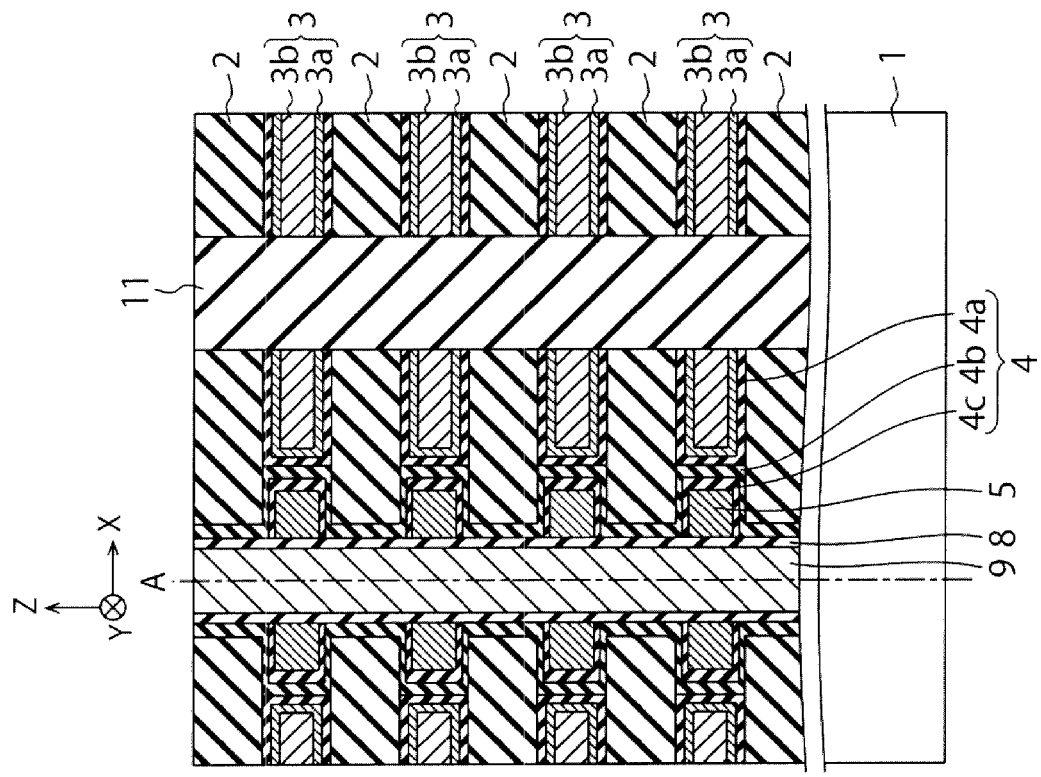

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2019-168480, filed Sep. 17, 2019, the entire contents of which are incorporated herein by reference.

FIELD

Embodiments described herein relate generally to a semiconductor device and a method for manufacturing the semiconductor device.

BACKGROUND

A semiconductor film such as a polysilicon layer, or an insulating film such as a silicon nitride film is often used as a charge storage film of a semiconductor memory. If the performance of the charge storage film is poor, it is possible that electric charge may not be appropriately stored in the charge storage film.

Examples of related art include U.S. Pat. No. 8,772,856.

DESCRIPTION OF THE DRAWINGS

FIGS. 3A and 3B are cross-sectional views (1/8) illustrating a process for manufacturing the semiconductor device according to the first embodiment;

FIGS. 8A and 8B are cross-sectional views (6/8) illustrating the process for manufacturing the semiconductor device according to the first embodiment;

FIGS. 9A and 9B are cross-sectional views (7/8) illustrating the process for manufacturing the semiconductor device according to the first embodiment;

FIGS. 11A and 11B are cross-sectional views showing the structure of a semiconductor device according to a second embodiment;

DETAILED DESCRIPTION

Embodiments provide a semiconductor device which can appropriately store electric charge in a charge storage film, and a method for manufacturing the semiconductor device.

In general, according to one embodiment, a semiconductor device includes a substrate, a plurality of insulating films and a plurality of electrode films provided alternately on the substrate. The semiconductor device further includes a first insulating film, a first charge storage film, a third insulating film, a second charge storage film, a second insulating film, and a first semiconductor film that are sequentially provided along at least one side surface of each of the electrode films. The first charge storage film includes either (i) molybdenum, or (ii) titanium and nitrogen, and the second charge storage film includes a semiconductor film.

Embodiments of the present disclosure will now be described with reference to the drawings. In FIGS. 1 through 16, the same symbols are used for the same components or elements, and a duplicate description thereof will be omitted.

First Embodiment

Figure 1A:
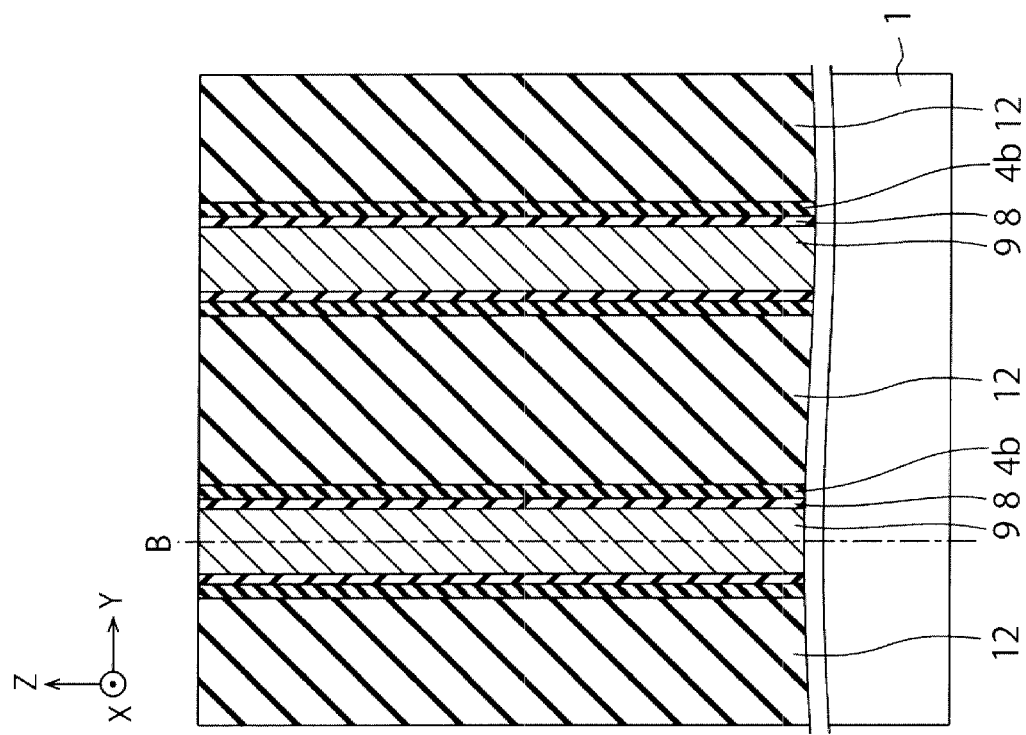
FIGS. 1A and 1B are cross-sectional views showing the structure of a semiconductor device according to a first embodiment.
Figure 1B:
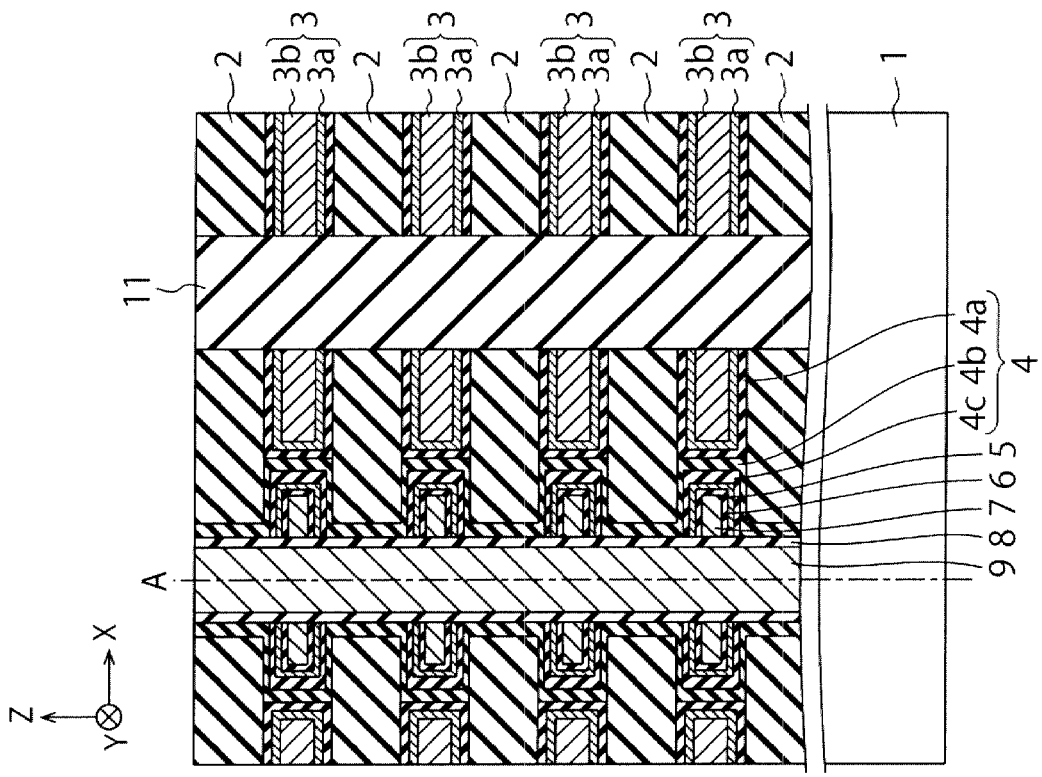
Figure 2:
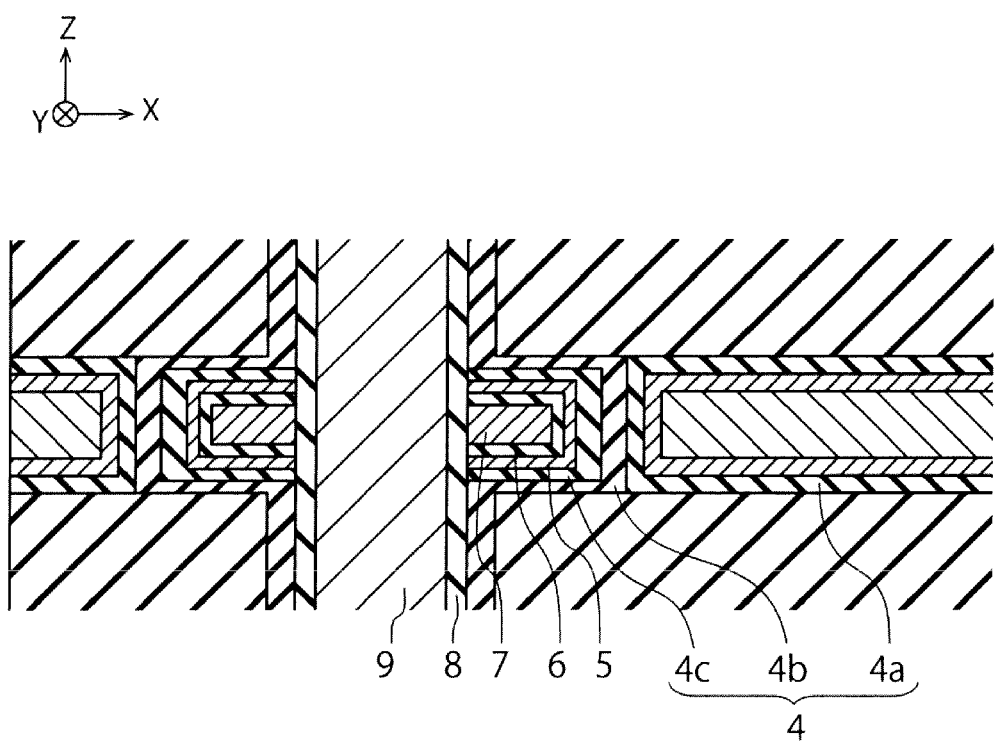
FIG. 2 is an enlarged cross-sectional view showing the structure of the semiconductor device according to the first embodiment.

FIGS. 1A and 1B are cross-sectional views showing the structure of a semiconductor device according to a first embodiment. FIG. 2 is an enlarged cross-sectional view showing the structure of the semiconductor device according to the first embodiment.

FIGS. 1A and 1B show different cross sections of the semiconductor device according to the first embodiment. FIG. 1B is a cross-sectional view on line A of FIG. 1A. FIG. 1A is a cross-sectional view on line B of FIG. 1B. FIG. 2 is an enlarged cross-sectional view of a portion of FIG. 1A. The semiconductor device of this embodiment is, for example, a three-dimensional semiconductor memory.

The structure of the semiconductor device of this embodiment will now be described with reference mainly to FIG. 1A and sometimes also to FIGS. 1B and 2.

The semiconductor device of this embodiment includes a substrate 1, a plurality of insulating films 2 and a plurality of electrode films 3 which are stacked alternately on the substrate 1, a block insulating film 4, a first charge storage film 5, an intermediate insulating film 6, a second charge storage film 7, a tunnel insulating film 8 and a channel semiconductor film 9 which are formed in this order on the side surface of each electrode film 3, and an insulating film 11 and an insulating film 12 which penetrate the insulating films 2 and the electrode films 3. Each electrode film 3 includes a barrier metal layer 3a and an electrode material layer 3b. The block insulating film 4 includes a first block insulating layer 4a, a second block insulating layer 4b and a third block insulating layer 4c. The block insulating film 4 is an example of a first insulating film, the intermediate insulating film is an example of a third insulating film, the tunnel insulating film 8 is an example of a second insulating film, and the channel semiconductor film 9 is an example of a first semiconductor film.

The substrate 1 is, for example, a semiconductor substrate such as a monocrystalline Si (silicon) substrate. FIG. 1A, etc. show an X direction and a Y direction which are parallel to the surface of the substrate 1 and perpendicular to each other, and a Z direction perpendicular to the surface of the substrate 1. A +Z direction is herein treated as an upward direction, and a −Z direction as a downward direction. The −Z direction may or may not coincide with the direction of gravitational force.

The insulating films 2 and the electrode films 3 are stacked alternately on the substrate 1. It should be noted, however, that the first block insulating film 4a intervenes between each insulating film 2 and an adjacent electrode film 3. The insulating films 2 are, for example, $SiO_2$ films (silicon oxide films). The electrode films 3 are, for example, metal films or semiconductor films and, in this embodiment, each includes a barrier metal layer 3a such as a TiN layer (titanium nitride layer), and an electrode material layer 3b such as a W (tungsten) layer. The number of layers of the insulating films 2 are, for example, not less than 30. The number of layers of the electrode films 3 are, for example, not less than 30.

As shown in FIG. 2, the block insulating film 4, the first charge storage film 5, the intermediate insulating film 6, the second charge storage film 7, the tunnel insulating film 8 and the channel semiconductor film 9 are formed in this order on the side surface of each electrode film 3. The films constitute a memory cell. Details of the respective films constituting a memory cell will now be described.

The block insulating film 4 is formed on the side surface of each electrode film 3, and includes the first block insulating layer 4a, the second block insulating layer 4b and the third block insulating layer 4c. The first block insulating layer 4a, the second block insulating layer 4b and the third block insulating layer 4c are, for example, an $AlO_x$ film (Al represents aluminum), an SiN film (silicon nitride film) and an $HfSiO_x$ film (Hf represents hafnium), respectively, and are formed on the side surface of each electrode film 3. The first block insulating layer 4a is formed also on the upper surface and the lower surface of each electrode film 3, while the second block insulating layer 4b and the third block insulating layer 4c are formed also on the upper surface and the lower surface of the first charge storage film 5. The thicknesses of the first block insulating layer 4a, the second block insulating layer 4b and the third block insulating layer 4c are, for example, 3 nm, 3 nm and 5 nm, respectively. Instead of an oxide film containing Hf, an oxide film containing Zr (zirconium) or Al may be used as the third block insulating layer 4c.

The first charge storage film 5 is formed on the side surface, the upper surface and the lower surface of the third block insulating layer 4c, and is used to store signal charge. The first charge storage film 5 is, for example, a metal film containing Mo (molybdenum) and, in the illustrated embodiment, is an Mo layer having a thickness of not more than 1.0 nm. The first charge storage film 5 may be formed of non-layered molybdenum. The thickness of the first charge storage film 5 is, for example, 0.05 nm to 1.0 nm, preferably 0.05 nm to 0.60 nm. The first charge storage film 5 of this embodiment functions as a charge trapping layer for trapping electric charge.

The intermediate insulating film 6 is formed on the side surface, the upper surface and the lower surface of the first charge storage film 5. The first charge storage film 5 and the second charge storage film 7 of this embodiment are electrically insulated from each other by the intermediate insulating film 6. The intermediate insulating film 6 is, for example, an $SiO_2$ film; however, an SiN film or an SiON film (silicon oxynitride film) may also be used. The thickness of the intermediate insulating film 6 is, for example, 2 nm.

The second charge storage film 7 is formed on the side surface, the upper surface and the lower surface of the intermediate insulating film 6, and is used to store signal charge. The second charge storage film 7 is, for example, a semiconductor film and, in the illustrated embodiment, is a polysilicon layer having a thickness of about 7 nm. In this embodiment the thickness of the second charge storage film 7 is set to be larger than the thickness of the first charge storage film 5. The second charge storage film 7 of this embodiment functions as a floating gate layer for storing electric charge.

The first charge storage film 5, the intermediate insulating film 6 and the second charge storage film 7 are formed between any two adjacent insulating films 2. On the other hand, the tunnel insulating film 8 and the channel semiconductor film 9 are formed in this order on the side surface of the second charge storage film 7 and on the side surfaces of the insulating films 2. In FIG. 1A, the tunnel insulating film 8 and the channel semiconductor film 9 are formed in this order on the side surfaces of the insulating films 2 and the electrode films 3. However, the first block insulating layer 4a intervenes between each insulating film 2 and the tunnel insulating film 8, and the block insulating film 4, the first charge storage film 5, the intermediate insulating film 6 and the second charge storage film 7 intervene between each electrode film 3 and the tunnel insulating film 8. The tunnel insulating film 8 is, for example, an $SiO_2$ film. The thickness of the tunnel insulating film 8 is, for example, 6 nm. The channel semiconductor film 9 is, for example, a polysilicon layer, and functions as a channel layer of the memory cells.

As shown in FIG. 1A, the insulating film 11 penetrates the insulating films 2 and the electrode films 3. The insulating film 11 is, for example, an $SiO_2$ film. As shown in FIG. 1B, the insulating film 12 also penetrates the insulating films 2 and the electrode films 3. The insulating film 12 is, for example, an $SiO_2$ film. The insulating films 11, 12 will be described in greater detail below.

The semiconductor device of this embodiment thus includes, as a region for storing electric charge (hereinafter referred to as a "charge storage region"), the first charge storage film 5, which is an Mo layer, and the second charge storage film 7 which is a polysilicon layer. An Mo layer has a high work function. Therefore, by forming not only a polysilicon layer but also an Mo layer as a charge storage region according to this embodiment, it becomes possible to increase the electron trapping efficiency of the charge storage region and to increase the threshold voltage variation of the memory cell. Further, the Mo layer has a high melting point. Therefore, even when the Mo layer is heated upon heat treatment, Mo atoms in the Mo layer are unlikely to diffuse e.g. into the block insulating film 4. Thus, the provision of the first charge storage film 5 consisting of an Mo layer according to this embodiment makes it possible to prevent deterioration of the block insulating film 4 due to diffusion of metal atoms from the first charge storage film 5. The work function and the melting point of Mo are about 5 eV and about 2500° C., respectively.

However, when the Mo layer is too thick or when the in-plane concentration of Mo atoms in the Mo layer (hereinafter referred to as the "in-plane Mo concentration") is too high, there is a possibility of diffusion of an appreciable amount of Mo atoms from the Mo layer. On the other hand, when the Mo layer is too thin or when the in-plane Mo concentration of the Mo layer is too low, there is a possibility that the Mo layer does not appropriately function as the first charge storage film 5.

It is, therefore, preferred that the thickness of the first charge storage film 5 of this embodiment be set within the range of 0.05 nm to 1.0 nm, e.g. within the range of 0.05 nm to 0.60 nm. It is preferred that the in-plane Mo concentration of the first charge storage film 5 of this embodiment be set within the range of $2.0 \times 10^{14}$ atoms/cm$^2$ to $4.0 \times 10^{15}$ atoms/cm$^2$, e.g. within the range of $2.0 \times 10^{14}$ atoms/cm$^2$ to $2.4 \times 10^{15}$ atoms/cm$^2$. This makes it possible to reduce the amount of Mo atoms that diffuse from the first charge storage film 5 while allowing the first charge storage film 5 to function in an appropriate manner.

In this embodiment, the direction in which the thickness of the first charge storage film 5 is determined is perpendicular to the direction in which the in-plane Mo concentration of the first charge storage film 5 is determined. For example, in an area where the first charge storage film 5 spreads in the X and Y directions, the thickness of the first charge storage film 5 is the Z-direction length of the first charge storage film 5, while the in-plane Mo concentration of the first charge storage film 5 is the number of Mo atoms per unit X-Y plane of the first charge storage film 5.

In addition to Mo atoms, the first charge storage film 5 of this embodiment may further contain atoms other than Mo atoms. For example, the first charge storage film 5 may be an Mo layer containing Mo atoms and impurity atoms other than Mo atoms. Examples of such impurity atoms include O (oxygen) atoms, N (nitrogen) atoms, C (carbon) atoms, Cl (chlorine) atoms, Si (silicon) atoms, V (vanadium) atoms, and W (tungsten) atoms. The inclusion of such additional atoms in the first charge storage film 5 according to this embodiment makes it possible to further prevent the diffusion of Mo atoms.

The semiconductor device of this embodiment includes the intermediate insulating film 6 between the first charge storage film 5 and the second charge storage film 7. This makes it possible to prevent diffusion of Mo atoms from the first charge storage film 5 to the second charge storage film 7 upon heat treatment, and to prevent the occurrence of a silicide reaction between the first charge storage film 5 (Mo layer) and the second charge storage film 7 (Si layer).

The semiconductor device of this embodiment may either include, as a charge storage region, the first charge storage film 5 (Mo layer) and the second charge storage film 7 (Si layer), or include only the first charge storage film 5 (Mo layer). The former case has, for example, the advantage that the Mo layer, which is difficult to process when it is thick, can be thinned. The latter case has, for example, the advantage that process steps for forming the intermediate insulating film 6 and the second charge storage film 7 can be omitted. The latter case will be described below in greater detail with reference to a second embodiment.

FIGS. 3 through 10 are cross-sectional views illustrating a process for manufacturing the semiconductor device according to the first embodiment. FIGS. 3A and 3B are cross-sectional views corresponding to FIGS. 1A and 1B, respectively. The same holds true for FIGS. 4A, 4B to FIGS. 10A, 10B.

First, a plurality of insulating films 2 and a plurality of sacrificial films 13 are stacked alternately on a substrate 1 by CVD (Chemical Vapor Deposition) (FIGS. 3A and 3B). The insulating films 2 and the sacrificial films 13 are stacked on the substrate 1 via another layer (e.g. an interlayer insulating film). The insulating films 2 are, for example, SiO$_2$ films having a thickness of 20 nm. The sacrificial films 13 are, for example, SiN films having a thickness of 30 nm. The insulating films 2 are an example of fourth insulating films, and the sacrificial films 13 are an example of fifth insulating films.

Figure 4B:
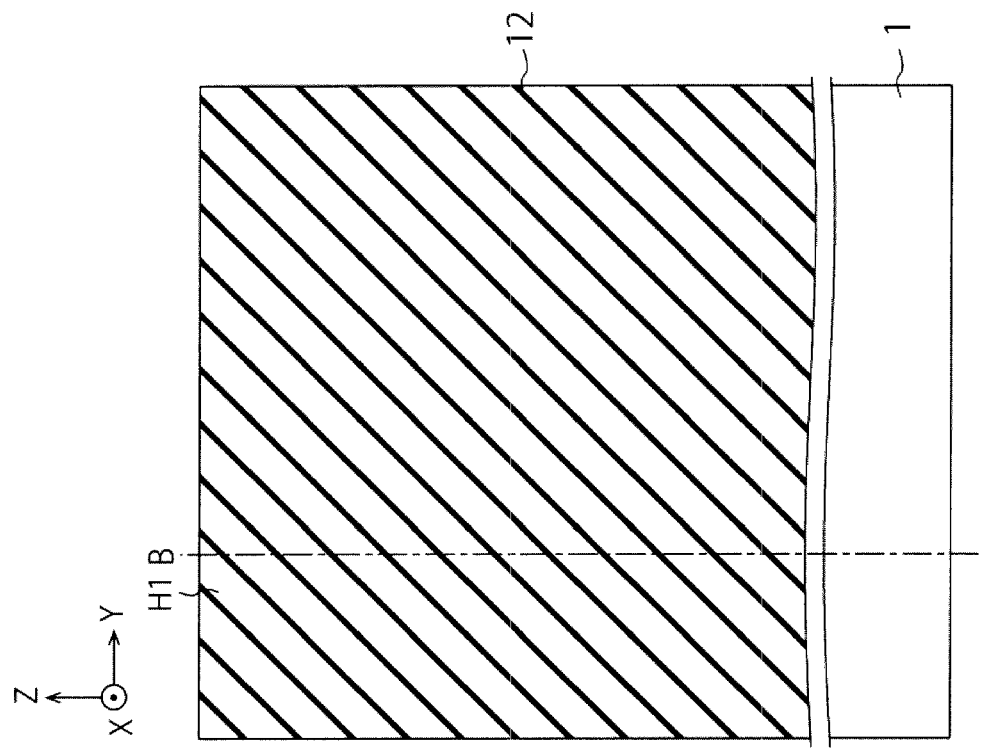
FIGS. 4A and 4B are cross-sectional views (2/8) illustrating the process for manufacturing the semiconductor device according to the first embodiment.
Figure 4A:
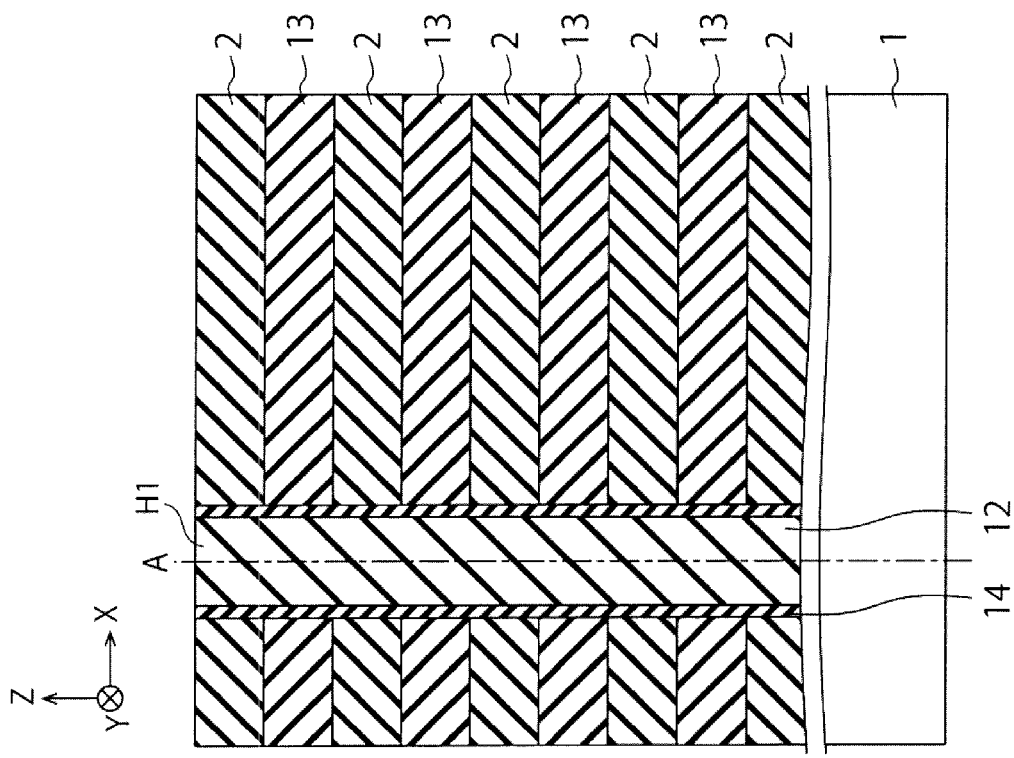

Next, a trench H1 which extends in the Y direction, penetrating the insulating films 2 and the sacrificial films 13, is formed by lithography and RIE (Reactive Ion Etching), and an insulating film 14 and the above-described insulating film 12 are sequentially embedded into the trench H1 (FIGS. 4A and 4B). The insulating film 14 is, for example, an SiN film. The insulating film 12 is, for example, an SiO$_2$ film.

Figure 5B:
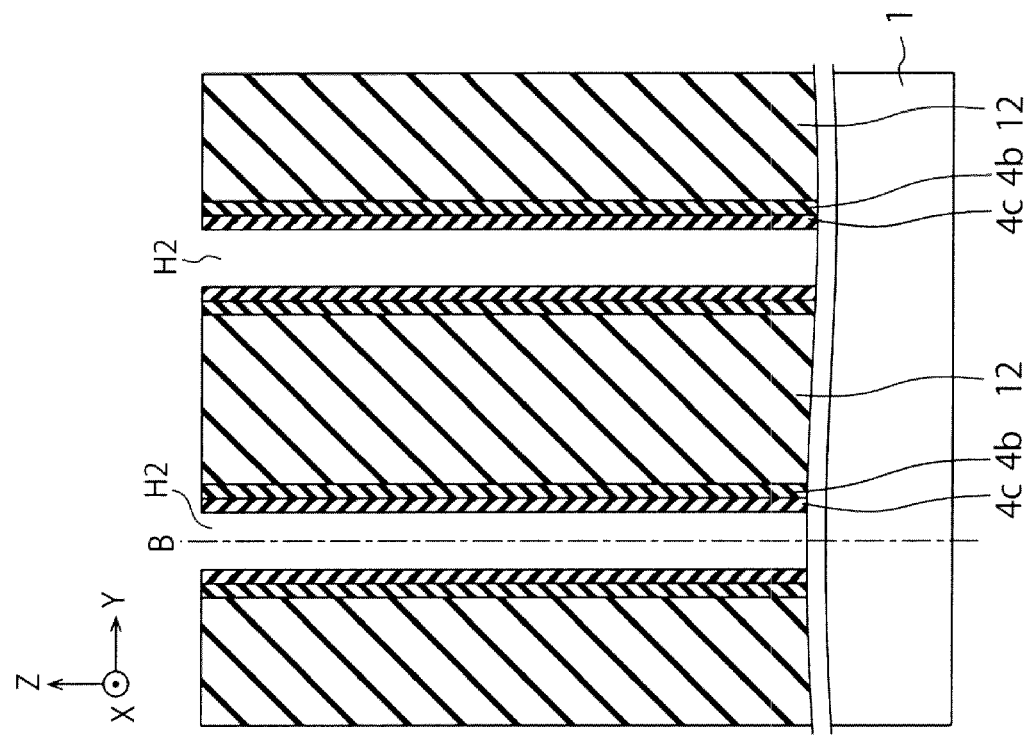
FIGS. 5A and 5B are cross-sectional views (3/8) illustrating the process for manufacturing the semiconductor device according to the first embodiment.
Figure 5A:
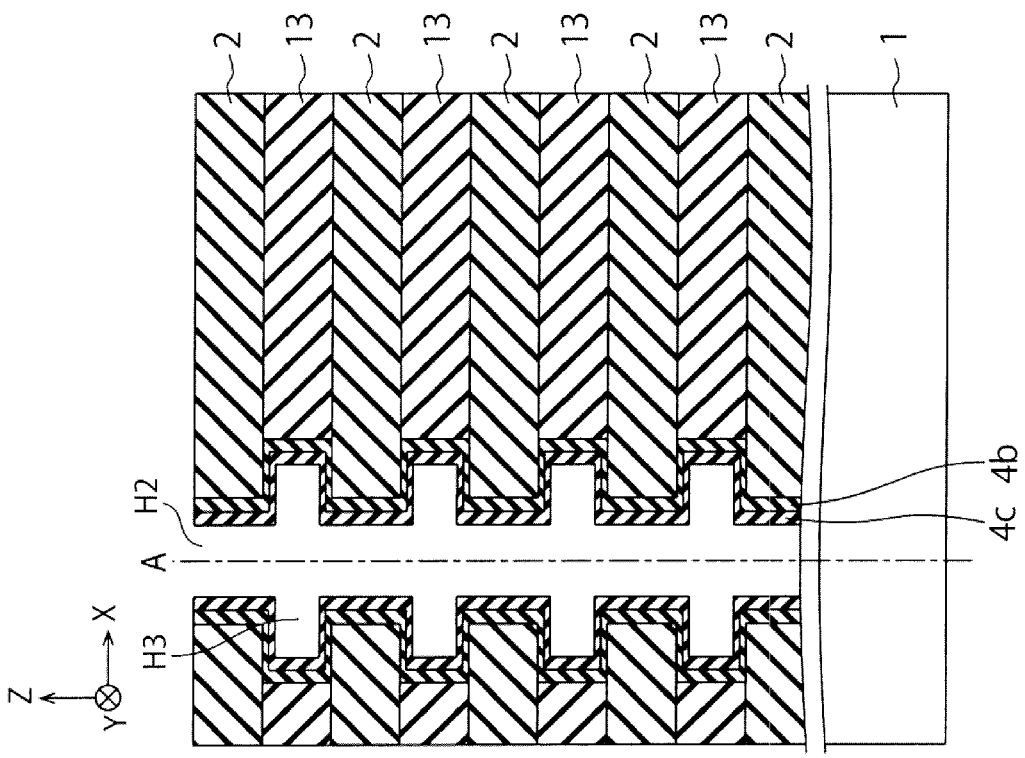

Next, a plurality of holes H2 which penetrate the insulating films 12, 14 are formed by lithography and RIE (FIGS. 5A and 5B). The sacrificial films 13 in the holes H2 are then etched by wet etching (FIGS. 5A and 5B). As a result, the side surfaces of the sacrificial films 13 in the holes H2 are recessed, and holes H3 are formed in the side surfaces of the sacrificial films 13.

Next, a second block insulating layer 4b is formed on the surfaces of the holes H2, H3 (FIGS. 5A and 5B). The second block insulating layer 4b is, for example, an SiN film having a thickness of 3 nm. After the formation of the second block insulating layer 4b, the layer may be subjected to an oxidation treatment and a heat treatment to form a not-shown SiO$_2$ film.

Next, a third block insulating layer 4c is formed on the surfaces of the holes H2, H3 via the second block insulating layer 4b, and the third block insulating layer 4c is heat-treated at about 900° C. (FIGS. 5A and 5B). The third block insulating layer 4c is, for example, an HfSiO$_x$ film having a thickness of 5 nm.

Figure 6B:
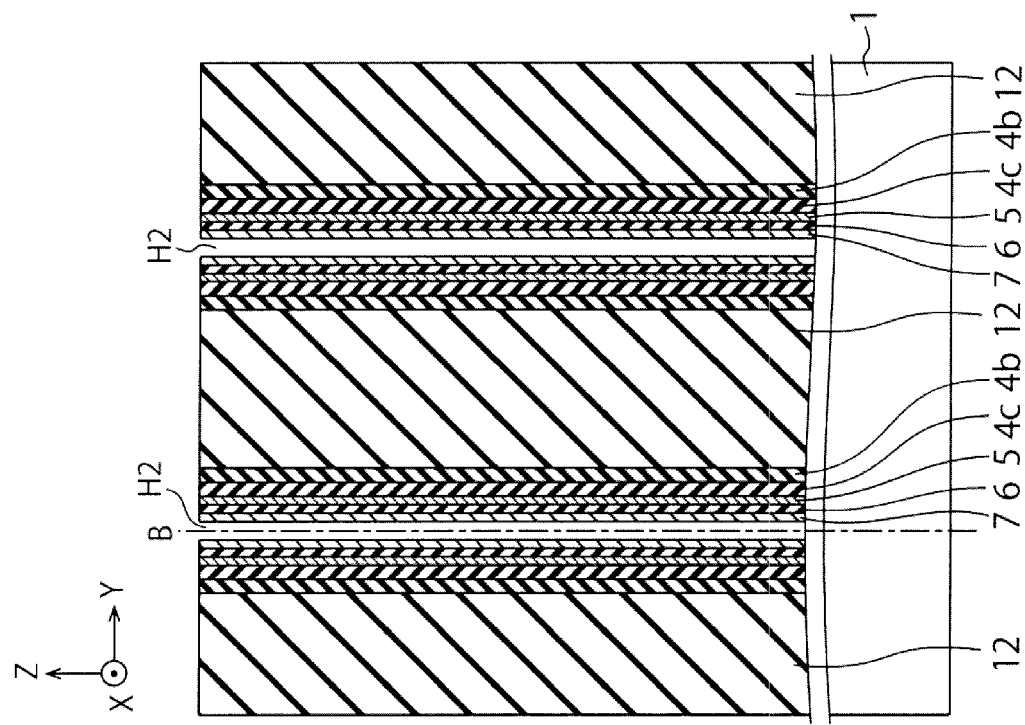
FIGS. 6A and 6B are cross-sectional views (4/8) illustrating the process for manufacturing the semiconductor device according to the first embodiment.
Figure 6A:
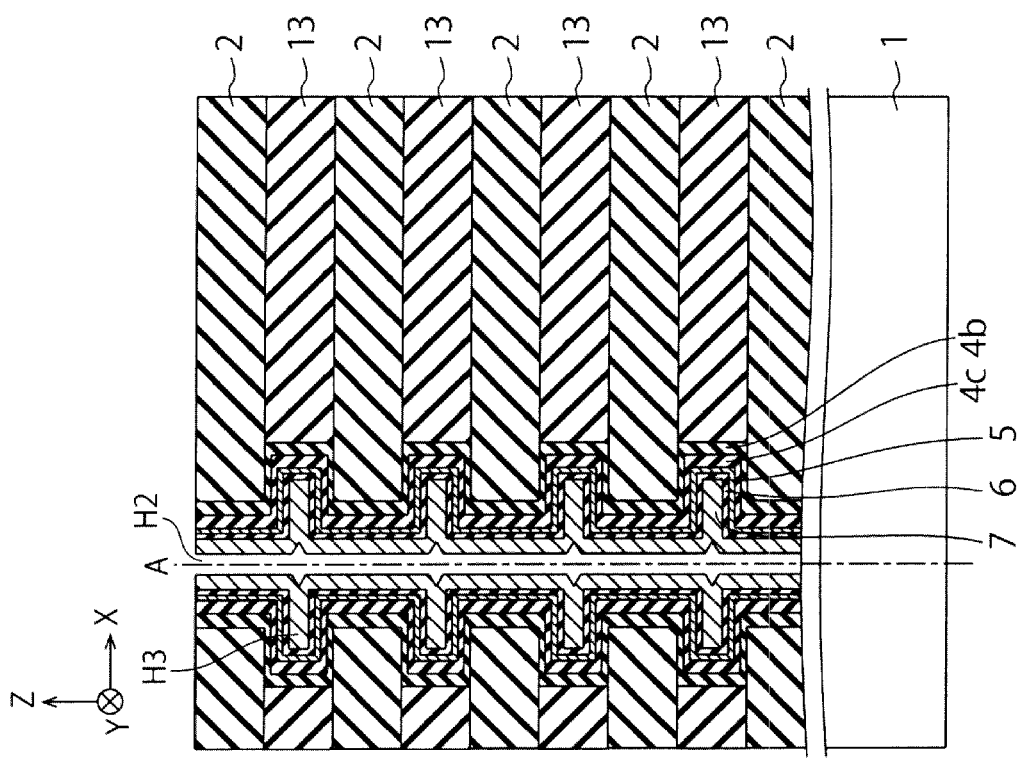

Next, a first charge storage film 5, an intermediate insulating film 6 and a second charge storage film 7 are sequentially formed on the surfaces of the holes H2, H3 via the second and third block insulating layers 4b, 4c (FIGS. 6A and 6B). The first charge storage film 5 is, for example, an Mo layer having a thickness of not more than 1.0 nm, and may be formed by CVD. The is, for example, an SiO$_2$ film having a thickness of 2.0 nm, and may be formed by ALD (Atomic Layer Deposition). After the formation of the intermediate insulating film 6, the intermediate insulating film 6 is heat-treated at about 900° C. The second charge storage film 7 is, for example, a polysilicon layer having a thickness of about 20 nm, and may be formed by CVD. In this embodiment, the holes H3 become filled with the second and third block insulating layers 4b, 4c, the first charge storage film 5, the intermediate insulating film 6 and the second charge storage film 7 at this stage.

Figure 7B:
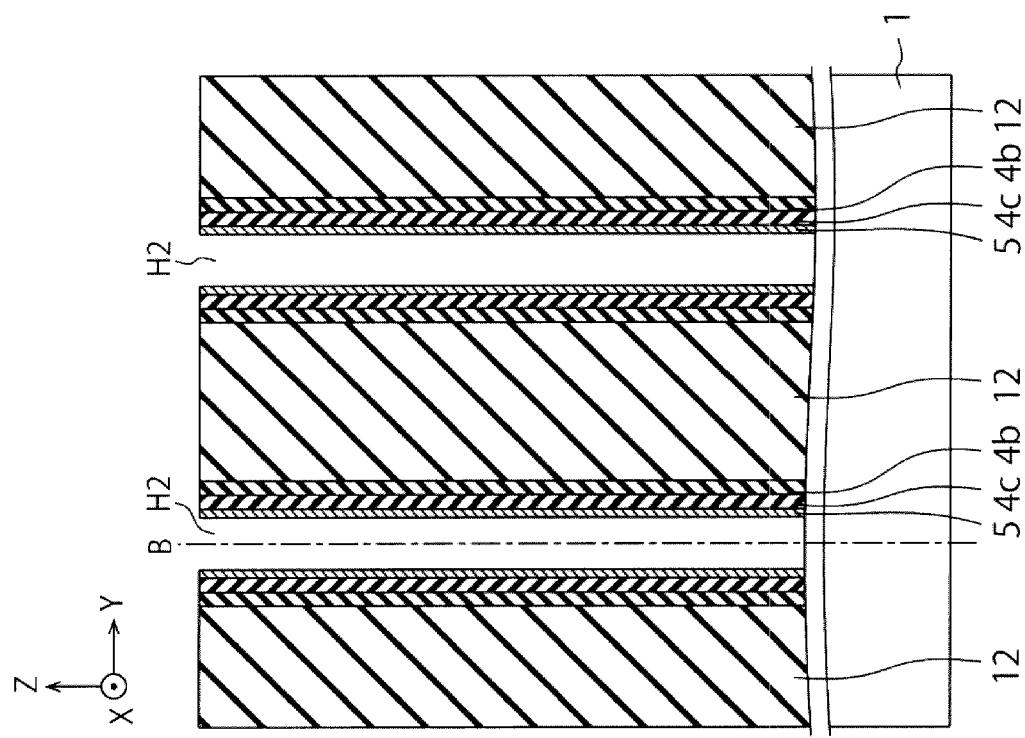
FIGS. 7A and 7B are cross-sectional views (5/8) illustrating the process for manufacturing the semiconductor device according to the first embodiment.
Figure 7A:
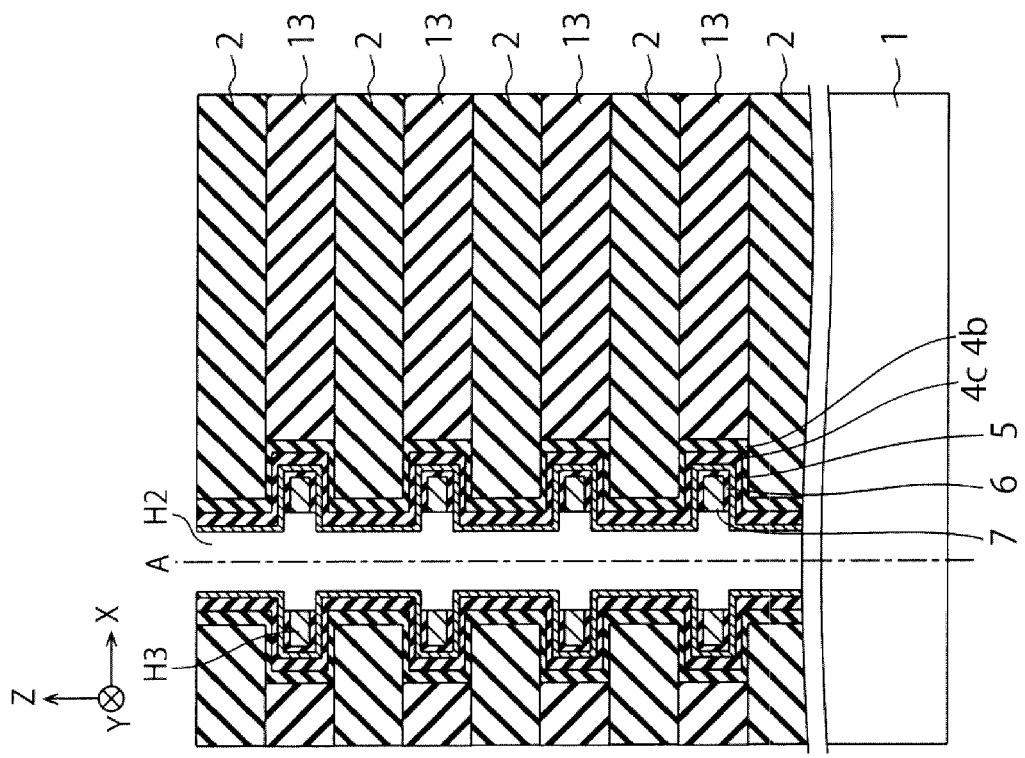

Next, the second charge storage film 7 and the intermediate insulating film 6 in the holes H2 are removed by wet etching, and the second charge storage film 7 in the holes H3 is thinned (FIGS. 7A and 7B). The thinned second charge storage film 7 has a thickness of about 7 nm. Next, the first charge storage film 5 and the third block insulating layer 4c in the holes H2 are removed by wet etching (FIGS. 8A and 8B).

Next, a tunnel insulating film 8 and a channel semiconductor film 9 are sequentially formed on the surfaces of the holes H2 (FIGS. 9A and 9B). The tunnel insulating film 8 is, for example, an SiO$_2$ film having a thickness of 6.0 nm.

After the formation of the tunnel insulating film 8, the tunnel insulating film 8 is subjected to heat treatment. The channel semiconductor film 9 may be formed, for example, by forming an impurity-containing amorphous silicon layer on the surface of the tunnel insulating film 8, and subjecting the amorphous silicon layer to heat treatment. The amorphous silicon layer is crystallized by the heat treatment to form a polysilicon layer as the channel semiconductor film 9. The second and third block insulating layers 4b, 4c, the first charge storage film 5, the intermediate insulating film 6, the second charge storage film 7, the tunnel insulating film 8 and the channel semiconductor film 9 are thus formed sequentially on the side surface of each sacrificial film 13.

Next, a trench H4 which extends in the Y direction, penetrating the insulating films 2 and the sacrificial films 13, is formed by lithography and RIE (FIGS. 9A and 9B). The sacrificial films 13 in the trench H4 are then removed by wet etching (FIGS. 9A and 9B). As a result, holes H5 which reach the second block insulating layer 4b are formed in the surface of the trench H4.

Figure 10B:
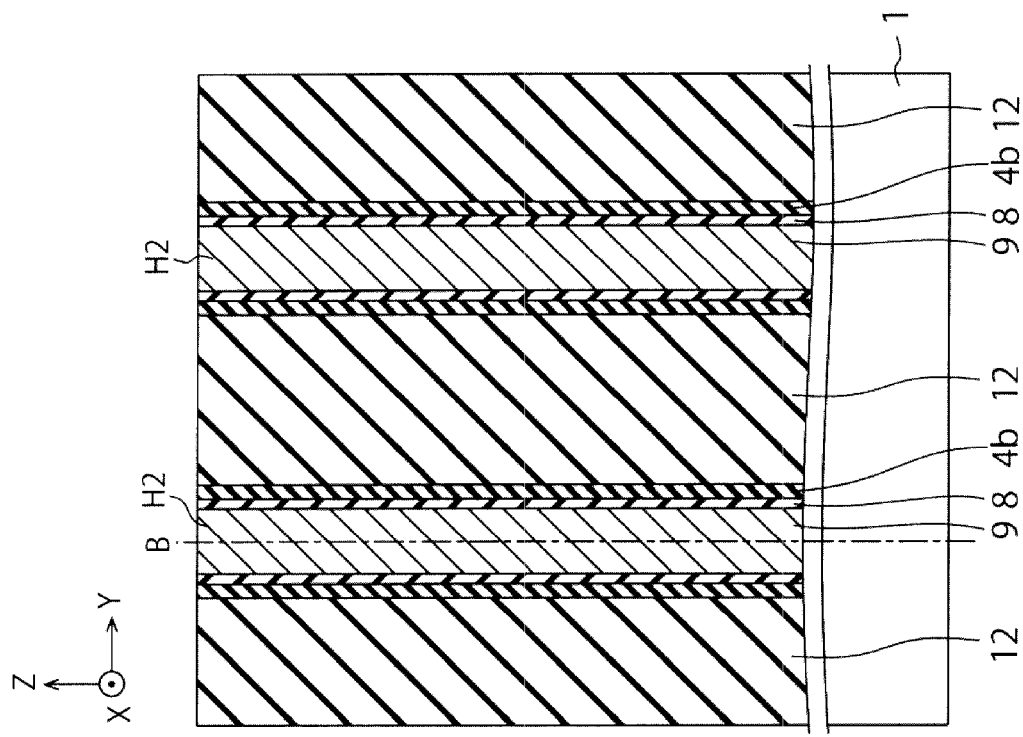
FIGS. 10A and 10B are cross-sectional views (8/8) illustrating the process for manufacturing the semiconductor device according to the first embodiment.
Figure 10A:
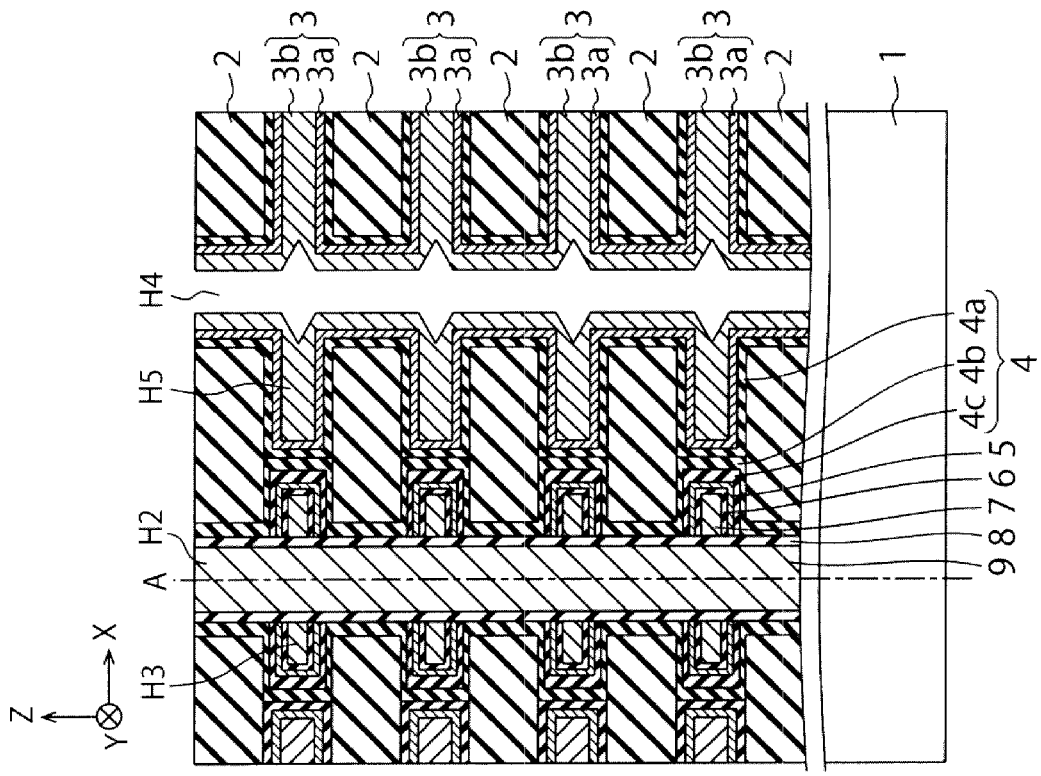

Next, a first block insulating layer 4a, a barrier metal layer 3a and an electrode material layer 3b are sequentially formed on the surfaces of the trench H4 and the holes H5 (FIGS. 10A and 10B). The electrode film 3, the block insulating film 4, the first charge storage film 5, the intermediate insulating film 6, and the second charge storage film 7 are thus sequentially formed in the holes H3, H5, i.e. between adjacent insulating films 2. The first block insulating layer 4a is, for example, an $AlO_x$ film having a thickness of 3 nm, and may be formed by ALD. After the formation of the first block insulating layer 4a, the first block insulating layer 4a is subjected to heat treatment. The barrier metal layer 3a is, for example, a TiN layer, and may be formed by CVD. The electrode material layer 3b is, for example, a W layer, and may be formed by CVD. In this embodiment, the holes H5 become filled with the first block insulating layer 4a, the barrier metal layer 3a and the electrode material layer 3b at this stage.

Thus, in this embodiment, part of each sacrificial film 13 is replaced with the second and third block insulating layers 4b, 4c, the first charge storage film 5, the intermediate insulating film 6 and the second charge storage film 7, while the remainder of the sacrificial film 13 is replaced with the first block insulating layer 4a, the barrier metal layer 3a and the electrode material layer 3b. As a result, the electrode film 3, the block insulating film 4, the first charge storage film 5, the intermediate insulating film 6, and the second charge storage film 7 are sequentially formed between adjacent insulating films 2.

Thereafter, the electrode material layer 3b, the barrier metal layer 3a and the first block insulating layer 4a in the trench H4 are removed by wet etching, and the above-described insulating film 11 is embedded into the trench H4. The insulating film 11 is, for example, an $SiO_2$ film. The semiconductor device shown in FIGS. 1A and 1B is thus manufactured.

As described hereinabove, the semiconductor device of this embodiment includes, as a charge storage region, the first charge storage film 5 containing Mo and the second charge storage film 7 which is a semiconductor film. Therefore, according to this embodiment, it becomes possible to enhance the performance of a charge storage region and to prevent diffusion of metal atoms from the charge storage region, thus making it possible to appropriately store electric charge in the charge storage region.

Second Embodiment

Figure 12:
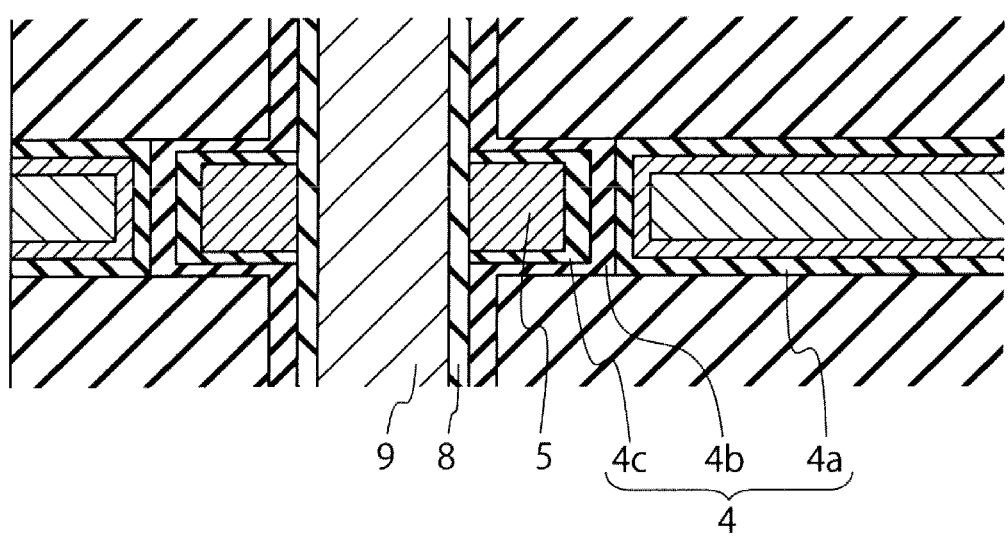
FIG. 12 is an enlarged cross-sectional view showing the structure of the semiconductor device according to the second embodiment.

FIGS. 11A and 11B are cross-sectional views showing the structure of a semiconductor device according to a second embodiment. FIG. 12 is an enlarged cross-sectional view showing the structure of the semiconductor device according to the second embodiment.

FIGS. 11A and 11B show different cross sections of the semiconductor device according to the second embodiment. FIG. 11B is a cross-sectional view on line A of FIG. 11A. FIG. 11A is a cross-sectional view on line B of FIG. 11B. FIG. 12 is an enlarged cross-sectional view of a portion of FIG. 11A.

The structure of the semiconductor device of this embodiment will now be described with reference mainly to FIG. 11A.

The semiconductor device of this embodiment has the same structure as the semiconductor device of the first embodiment except that the first charge storage film 5, the intermediate insulating film 6 and the second charge storage film 7 of the first embodiment are replaced with a first charge storage film 5 in this embodiment. Thus, the semiconductor device of this embodiment includes only the first charge storage film 5 as a charge storage region.

As with the first charge storage film 5 of the first embodiment, the first charge storage film 5 of this embodiment is a metal film containing Mo, for example an Mo layer. The thickness of the first charge storage film 5 of this embodiment is, for example, about 5 to 10 nm. The first charge storage film 5 of this embodiment may contain the same impurity atoms as those of the first embodiment.

As described hereinabove, the semiconductor device of this embodiment includes the first charge storage film 5 containing Mo as a charge storage region. Therefore, according to this embodiment, it becomes possible to enhance the performance of a charge storage region and to prevent diffusion of metal atoms from the charge storage region, thus making it possible to appropriately store electric charge in the charge storage region. Furthermore, according to this embodiment, process steps for forming the intermediate insulating film 6 and the second charge storage film 7 can be omitted.

The semiconductor device of this embodiment can be manufactured, for example, by the same process as that illustrated in FIGS. 3A through 10B, provided that the process steps for the intermediate insulating film 6 and the second charge storage film 7 are omitted.

Third Embodiment

Figure 13B:
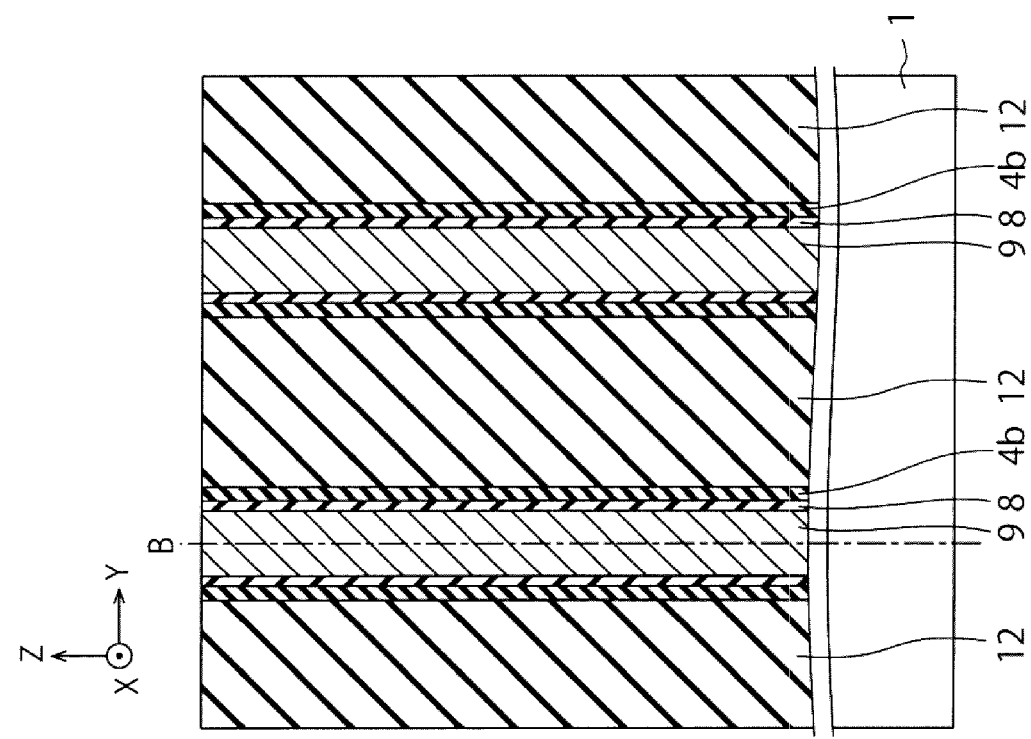
FIGS. 13A and 13B are cross-sectional views showing the structure of a semiconductor device according to a third embodiment.
Figure 13A:
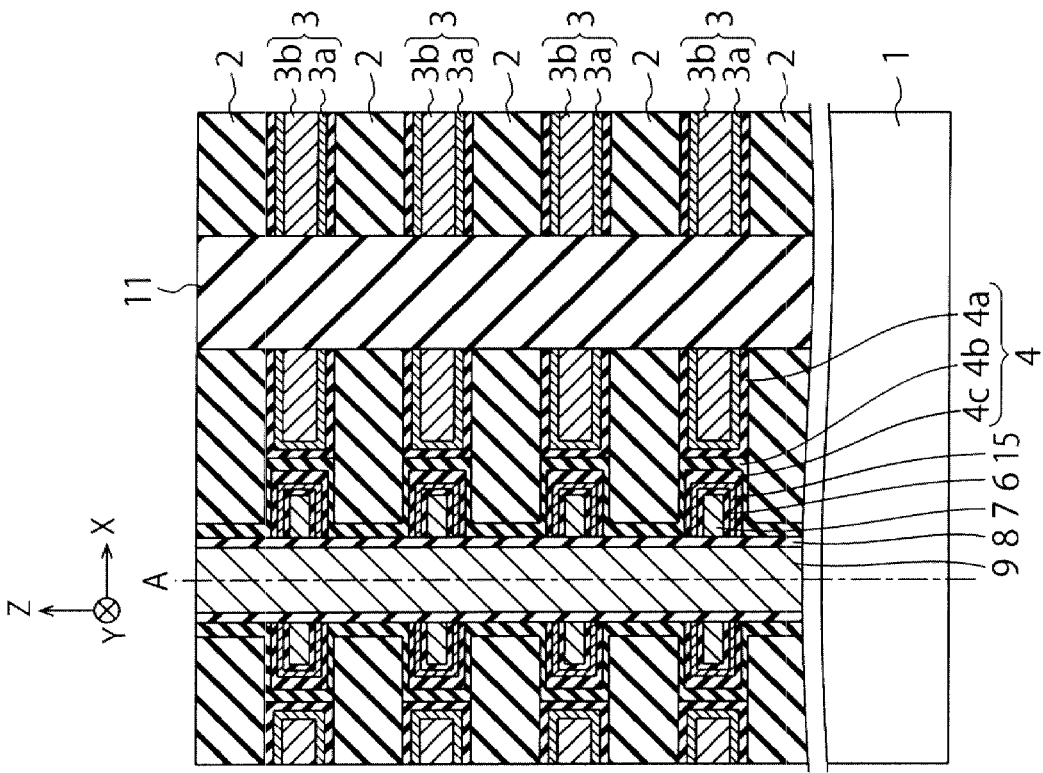
Figure 14:
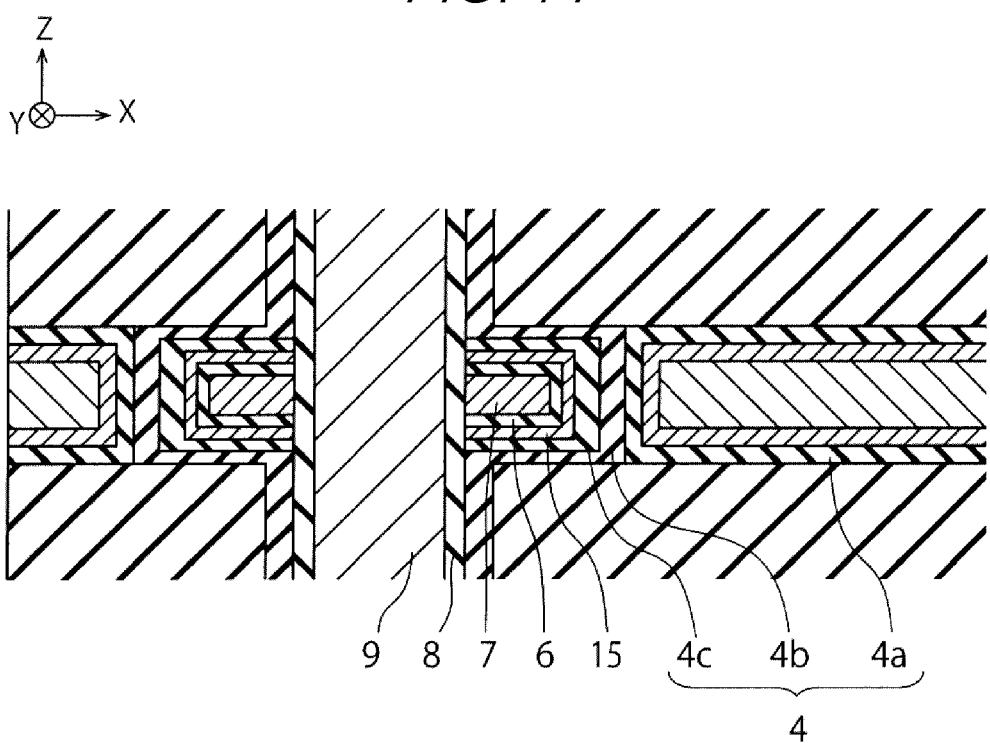
FIG. 14 is an enlarged cross-sectional view showing the structure of the semiconductor device according to the third embodiment.

FIGS. 13A and 13B are cross-sectional views showing the structure of a semiconductor device according to a third embodiment. FIG. 14 is an enlarged cross-sectional view showing the structure of the semiconductor device according to the third embodiment.

FIGS. 13A and 13B show different cross sections of the semiconductor device according to the third embodiment. FIG. 13B is a cross-sectional view on line A of FIG. 13A. FIG. 13A is a cross-sectional view on line B of FIG. 13B. FIG. 14 is an enlarged cross-sectional view of a portion of FIG. 13A.

The structure of the semiconductor device of this embodiment will now be described with reference mainly to FIG. 13A.

The semiconductor device of this embodiment has the same structure as the semiconductor device of the first embodiment except that the first charge storage film 5 of the first embodiment is replaced with a first charge storage film 15 in this embodiment. Thus, the semiconductor device of this embodiment includes, as a charge storage region, the first charge storage film 15 and the second charge storage film 7.

The first charge storage film 15 of this embodiment is a metal film containing Ti and N, for example a TiN layer. The thickness of the first charge storage film 15 of this embodiment is, for example, 0.05 nm to 0.30 nm. The in-plane concentration of Ti atoms in the first charge storage film 15 of this embodiment (hereinafter referred to as the "in-plane Ti concentration") is, for example, $2.0 \times 10^{14}$ atoms/cm$^2$ to $1.2 \times 10^{15}$ atoms/cm$^2$. The first charge storage film 15 of this embodiment may contain the same impurity atoms as those of the first charge storage film 5 of the first embodiment.

The semiconductor device of this embodiment thus includes, as a charge storage region, the first charge storage film 15 which is a TiN layer, and the second charge storage film 7 which is a polysilicon layer. The TiN layer has a high work function though it is lower than that of an Mo layer. Therefore, by forming not only the polysilicon layer but also the TiN layer as a charge storage region according to this embodiment, it becomes possible to increase the electron trapping efficiency of the charge storage region and to increase the threshold voltage variation of the memory cell.

However, Ti element has a low melting point. Therefore, when a TiN layer is heated upon heat treatment, Ti atoms in the TiN layer may diffuse e.g. into the block insulating film 4, thereby deteriorating the insulating properties of the block insulating film 4. In view of this, the thickness of the first charge storage film 15 of this embodiment is preferably set within the range of 0.05 nm to 0.3 nm. The in-plane Ti concentration of the first charge storage film 15 of this embodiment is preferably set within the range of $2.0 \times 10^{14}$ atoms/cm$^2$ to $1.2 \times 10^{15}$ atoms/cm$^2$. The work function of TiN is about 4.5 eV, and the melting point of Ti is about 1700° C.

As described hereinabove, the semiconductor device of this embodiment includes, as a charge storage region, the first charge storage film 15 containing Ti and N, and the second charge storage film 7 which is s semiconductor film. Therefore, according to this embodiment, it becomes possible to enhance the performance of a charge storage region and to prevent diffusion of metal atoms from the charge storage region, thus making it possible to appropriately store electric charge in the charge storage region.

The semiconductor device of this embodiment can be manufactured, for example, by the same process as that illustrated in FIGS. 3A through 10B, provided that the process steps for the first charge storage film 5 are replaced with process steps for the first charge storage film 15.

Comparison Between First Embodiment and Third Embodiment

FIGS. 15 and 16 are graphs illustrating characteristics of the semiconductor device according to the first embodiment and the semiconductor device according to the third embodiment.

Figure 15B:
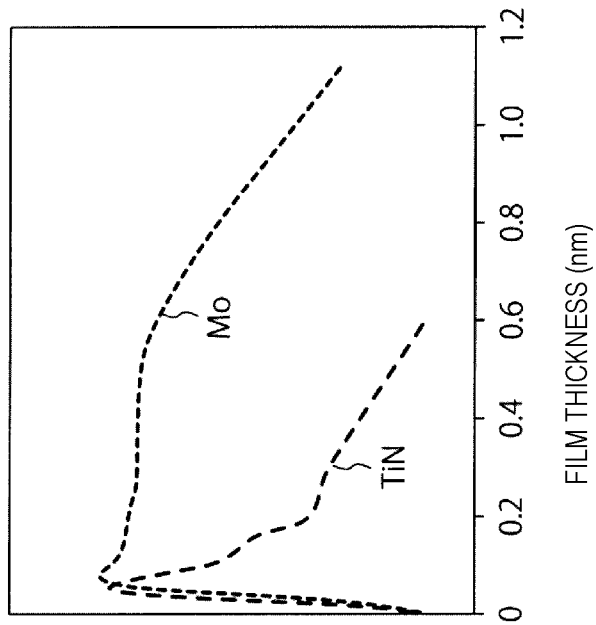
FIGS. 15A and 15B are graphs illustrating characteristics of the semiconductor device according to the first embodiment and the semiconductor device according to the third embodiment.
Figure 15A:
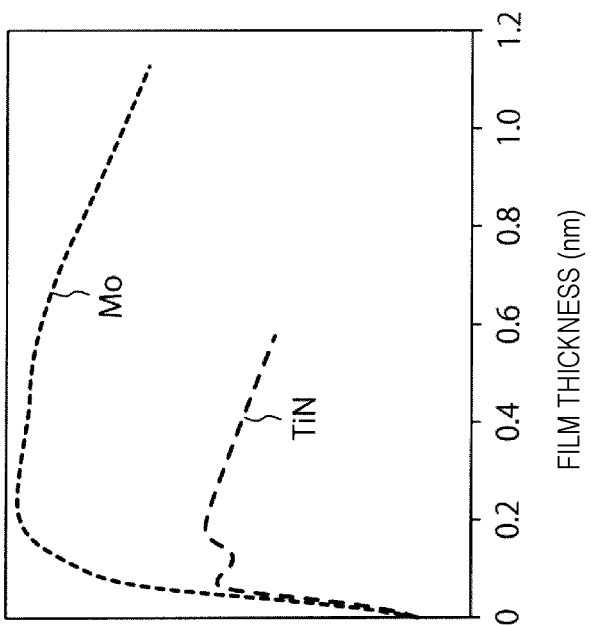
Figure 16B:
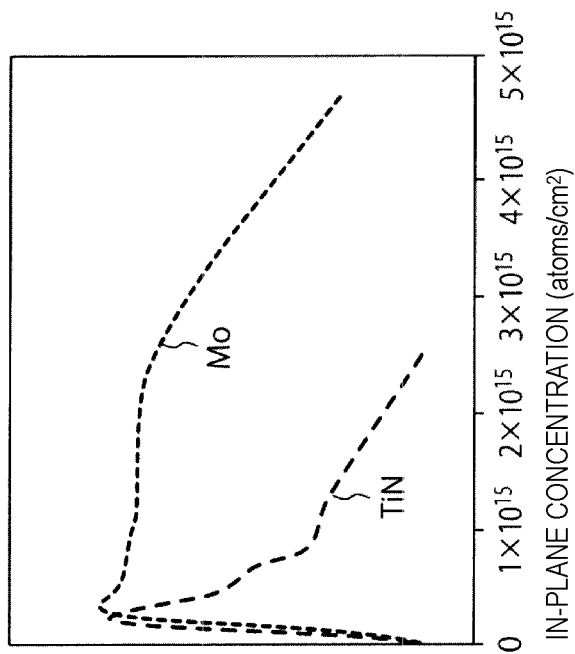
FIGS. 16A and 16B are graphs illustrating characteristics of the semiconductor device according to the first embodiment and the semiconductor device according to the third embodiment.
Figure 16A:
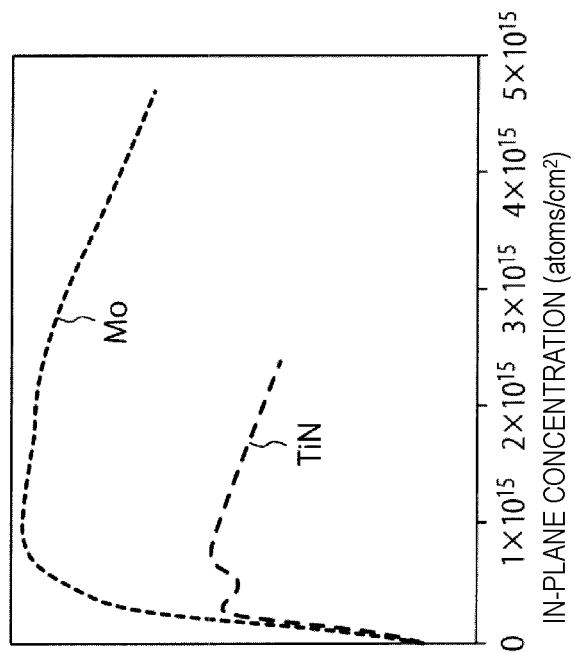

FIG. 15A shows the relationship between the thickness of the first charge storage film 5 (Mo layer) of the first embodiment and the write speed of the semiconductor device of the first embodiment. FIG. 15A also shows the relationship between the thickness of the first charge storage film 15 (TiN layer) of the third embodiment and the write speed of the semiconductor device of the third embodiment. FIG. 16A shows data as obtained when the thickness of the Mo layer and the thickness of the TiN layer are replaced with the in-plane Mo concentration of the Mo layer and the in-plane Ti concentration of the TiN layer in the abscissa axis of FIG. 15A.

FIG. 15B shows the relationship between the thickness of the first charge storage film 5 (Mo layer) of the first embodiment and the write saturation voltage of the semiconductor device of the first embodiment. FIG. 15B also shows the relationship between the thickness of the first charge storage film 15 (TiN layer) of the third embodiment and the write saturation voltage of the semiconductor device of the third embodiment. FIG. 16B shows data as obtained when the thickness of the Mo layer and the thickness of the TiN layer are replaced with the in-plane Mo concentration of the Mo layer and the in-plane Ti concentration of the TiN layer in the abscissa axis of FIG. 15B.

The data of FIGS. 15A and 15B indicates that the characteristics of the semiconductor device of the first embodiment are good when the thickness of the Mo layer is approximately in the range of 0.05 nm to 0.6 nm. With respect to the characteristics of the semiconductor device of the third embodiment, the characteristic shown in FIG. 15A does not change significantly with the thickness of the TiN layer, while the characteristic shown in FIG. 15B is good when the thickness of the TiN layer is approximately in the range of 0.05 nm to 0.3 nm. Therefore, in the first and third embodiments, the thickness of the Mo layer and the thickness of the TiN layer are to be preferably set in the above-described ranges. The relationships of the characteristics with the in-plane Mo concentration of the Mo layer and the in-plane Ti concentration of the TiN layer, shown in FIGS. 16A and 16B, are the same as those of FIGS. 15A and 15B.

While certain embodiments have been described, these embodiments have been presented by way of example only, and are not intended to limit the scope of the inventions. For example, the first charge storage film 5 is not limited to Mo and can include one or more molybdenum compounds such as, for example, MoC, MoS or MoN. MoO$_2$Cl$_2$ is reduced with C$_2$H$_2$, H$_2$S or NH$_3$ to be MoC, MoS or MoN. The temperature for the reduction is less than 420 degrees, for example. The temperature for the reduction is lower than the temperature for the Mo layer formation by CVD, so a by-product during the reduction is easily removed. Furthermore, since a Mo compound is not diffused easily by oxidation, a degradation of a memory cell's write performance can be suppressed. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a plurality of insulating films and a plurality of electrode films provided alternately on the substrate; and
   a first insulating film, a first charge storage film, a third insulating film, a second charge storage film, a second insulating film, and a first semiconductor film that are sequentially provided along at least one side surface of each of the electrode films,
   wherein the first charge storage film includes either (i) molybdenum, or (ii) titanium and nitrogen, and
   wherein the second charge storage film includes a semiconductor film.

2. The semiconductor device according to claim 1, wherein the first charge storage film includes molybdenum, and a thickness of the first charge storage film is from about 0.05 nm to about 1.0 nm.

3. The semiconductor device according to claim 1, wherein an in-plane concentration of molybdenum in the first charge storage film is at least $2.0\times10^{14}$ atoms/cm$^2$ and not more than $4.0\times10^{15}$ atoms/cm$^2$.

4. The semiconductor device according to claim 1, wherein the first charge storage film includes (a) molybdenum and (b) at least one of oxygen, nitrogen, carbon, sulfur, chlorine, silicon, vanadium, or tungsten.

5. The semiconductor device according to claim 1, wherein the first charge storage film contains titanium and nitrogen, and a thickness of the first charge storage film is from about 0.05 nm to about 0.30 nm.

6. The semiconductor device according to claim 1, wherein an in-plane concentration of titanium in the first charge storage film is at least $2.0\times10^{14}$ atoms/cm$^2$ and not more than $1.2\times10^{15}$ atoms/cm$^2$.

7. The semiconductor device according to claim 1, wherein the first insulating film is an oxide film including at least one of hafnium, zirconium or aluminum.

8. The semiconductor device according to claim 1, wherein the third insulating film includes silicon and is either an oxide film, or a nitride film or an oxynitride film.

9. The semiconductor device according to claim 1, wherein the first charge storage film and the second charge storage film are provided between the plurality of insulating films.

10. The semiconductor device according to claim 1, wherein the first charge storage film and the second charge storage film are electrically insulated from each other.

11. The semiconductor device according to claim 1, wherein the first semiconductor film is provided along a side surface of the second charge storage film and side surfaces of the plurality of insulating films via the second insulating film.

12. A semiconductor device comprising:
a substrate;
a plurality of insulating films and a plurality of electrode films that are provided alternately on the substrate; and
a first insulating film, a first charge storage film, a second insulating film, and a first semiconductor film which are sequentially provided along at least one side surface of each of the electrode films,
wherein the first charge storage film includes molybdenum, and overlaps with a portion of the first insulating film in a direction perpendicular to the at least one side surface of each of the electrode films.

13. A method for manufacturing a semiconductor device, comprising:
forming, on a substrate, a plurality of fourth insulating films and a plurality of fifth insulating films alternately on top of one another;
sequentially forming a first insulating film, a first charge storage film, a third insulating film, a second charge storage film, a second insulating film, and a first semiconductor film along at least one side surface of each of the fifth insulating films; and
replacing the fifth insulating films with a plurality of electrode films,
wherein the first charge storage film includes either (i) molybdenum, or (ii) titanium and nitrogen, and
wherein the second charge storage film is a semiconductor film.

14. The semiconductor device according to claim 12, wherein a thickness of the first charge storage film is from about 0.05 nm to about 1.0 nm.

15. The method according to claim 13, wherein the first charge storage film includes molybdenum, and a thickness of the first charge storage film is from about 0.05 nm to about 1.0 nm.

16. The method according to claim 13, wherein the first charge storage film contains titanium and nitrogen, and a thickness of the first charge storage film is from about 0.05 nm to about 0.30 nm.

17. The semiconductor device according to claim 12, wherein a first distance laterally from the first semiconductor film to the first charge storage film at a first vertical position of each of the plurality of electrode films and a second distance laterally from the first semiconductor film to the first insulating film at a second vertical position of each of the plurality of insulating films are both determined according to a thickness of the second insulating film.

18. The semiconductor device according to claim 12, wherein the first insulating film includes a first insulating portion provided on the side surface of each of the electrode films, a second insulating portion provided on a side surface of the first charge storage film, and a third insulating portion provided between the first insulating portion and the second insulating portion and extending to a side surface of one or more of the plurality of insulating films.

* * * * *